US012772372B2

(12) United States Patent
Su

(10) Patent No.: US 12,772,372 B2
(45) Date of Patent: Oct. 20, 2026

(54) SHIELDABLE CIRCUIT BOARD STRUCTURE

(71) Applicant: Chen-Wei Su, Taipei City (TW)

(72) Inventor: Chen-Wei Su, Taipei City (TW)

( * ) Notice: Subject to any disclaimer, the term of this patent is extended or adjusted under 35 U.S.C. 154(b) by 195 days.

(21) Appl. No.: 18/889,865

(22) Filed: Sep. 19, 2024

(65) Prior Publication Data

US 2025/0016910 A1 Jan. 9, 2025

Related U.S. Application Data

(63) Continuation-in-part of application No. 18/687,567, filed as application No. PCT/CN2021/000175 on Aug. 30, 2021, now Pat. No. 12,621,938.

(51) Int. Cl.

*H05K 1/181* (2026.01)
*H05K 1/02* (2006.01)
*H05K 1/09* (2006.01)

(52) U.S. Cl.

CPC ........... *H05K 1/0218* (2013.01); *H05K 1/095* (2013.01); *H05K 1/181* (2013.01); *H05K 2201/0355* (2013.01)

(58) Field of Classification Search

CPC ......... H05K 1/02; H05K 1/0218–0219; H05K 1/0203; H05K 1/095; H05K 1/097; H05K 1/18; H05K 1/181–187; H05K 3/0044; H05K 3/4053; H05K 3/284; H05K 9/00; H05K 9/0024; H05K 2201/0355

USPC ........ 361/760–764, 782–784, 795, 816, 818; 257/660, 685–690, 787–790; 29/840–855

See application file for complete search history.

(56) References Cited

U.S. PATENT DOCUMENTS

| | | | | |
|---|---|---|---|---|
| 12,048,088 B2 * | 7/2024 | Bodvarsson | ......... | H05K 1/0218 |
| 2002/0129951 A1 * | 9/2002 | Babb | .................... | H05K 1/0218 174/370 |
| 2010/0195291 A1 | 8/2010 | Kimura et al. | | |
| 2019/0363055 A1 * | 11/2019 | Yazaki | .................... | B32B 15/08 |
| 2020/0288608 A1 * | 9/2020 | Umeda | .............. | C08G 59/4042 |
| 2022/0232742 A1 * | 7/2022 | Bodvarsson | ......... | H05K 1/0216 |

FOREIGN PATENT DOCUMENTS

| | | |
|---|---|---|
| CN | 101287328 A | 10/2008 |
| CN | 102610590 A | 7/2012 |
| CN | 112654130 A | 4/2021 |
| CN | 112825616 A | 5/2021 |
| JP | H04-139799 A | 5/1992 |

* cited by examiner

*Primary Examiner* — Tuan T Dinh

(74) *Attorney, Agent, or Firm* — Muncy, Geissler, Olds & Lowe, P.C.

(57) ABSTRACT

A shieldable circuit board structure includes a circuit board with a plurality of electronic components with chips welded on the surface thereof, a copper foil layer arranged in the circuit board and extends to the surface position of the outer periphery of each electronic component, and a three-layer structure of insulating layer, conductive layer and protective layer stacked on the circuit board. The deionized water and volatile alcohols in the components of each of the layers has a large number of unreacted functional groups. The rheology is controlled by volatile alcohols and deionized water through the gaps between hydrogen bonds, so that each of the layers is formed a film of uniform thickness when the film is transformed from a wet film to a dry film and cover the electronic components on the circuit board.

18 Claims, 10 Drawing Sheets

SHIELDABLE CIRCUIT BOARD STRUCTURE

CROSS REFERENCE TO RELATED APPLICATIONS

This application is a Continuation-In-Part of application Ser. No. 18/687,567, filed on Feb. 28, 2024; application Ser. No. 18/687,567, filed on Feb. 28, 2024 is a U.S. National Stage of International Application No. PCT/CN2021/000175, filed on Aug. 30, 2021, for which priority is claimed under 35 U.S.C. § 120, the entire contents of which are hereby incorporated by reference.

BACKGROUND OF THE INVENTION

1. Field of the Invention

The present invention relates to a shieldable circuit board structure, in particular to a stacked three-layer structure with an insulating layer, a conductive layer, and a protective layer sequentially formed on the surface of the circuit board. And deionized water and volatile alcohols are added to each layer respectively, so that the rheological strength of each layer can be controlled by deionized water and volatile alcohols.

2. Description of the Related Art

In order to solve the problems of EMI (Electromagnetic Interference), noise, crosstalk or heat dissipation, some manufacturers install metal shells on the circuit boards of electronic devices. The metal shell is used to cover the outside of the electronic components, and the metal shell is used to sense, absorb and shield electromagnetic waves, crosstalk, noise and provide heat dissipation. However, the circuit board equipped with a metal shell will increase the overall thickness, and the mold opening and assembly of the metal shell during production and manufacturing will also consume a lot of time and cost, thus failing to meet the development trend of electronic devices to be lighter, thinner, shorter and smaller.

Furthermore, in order to improve the market competitiveness of electronic devices, some related companies have developed a thin film structure with multiple layers of insulating layer, conductive layer of metal material (such as silver glue, etc.) coated on the surface of the circuit board, so that the circuit board can be designed in the form of a thin structure. The conductive layer of the metal material is attached to the surface of multiple electronic components on the circuit board through a glue dispensing process. However, the commonly used physical vapor deposition (PVD) and chemical vapor deposition (CVD) methods can form thin film structures on circuit boards. Although the conductive layer of metal materials (such as silver glue, etc.) can be formed into a thin film layer through high-temperature, high-energy sputtering, evaporation, etc., it will cause damage to the insulating layer below the conductive layer, and the conductive layer of metal materials (such as silver glue, etc.) can only be processed through the glue dispensing process.

Furthermore, when the relevant industry uses the glue dispensing process to form a thin film structure on the multiple electronic components on the circuit board, the edges and peripheries of the top sides of the multiple electronic components are prone to difficult adhesion, which in turn causes the film structure on the circuit board to have uneven thickness. When the thin circuit board is bent, the film structure will also crack. To this end, the relevant industry has significantly increased the stacking thickness of the thin film structure so that the thin film structure can completely cover the surface of multiple electronic components. However, a significant increase in the stacking thickness will also increase the amount of thin film material used in the process, resulting in higher material costs, longer film baking time, and longer production and processing time. And the thickness of the thin circuit board will also increase with the thickness of the film structure.

Therefore, how to solve the above problems and deficiencies is what those working in this industry are eager to study and improve.

SUMMARY OF THE INVENTION

The main object of the present invention is to provide a shieldable circuit board structure, which comprises a circuit board with a plurality of electronic components with chips welded on its surface, and a copper foil layer arranged inside the circuit board and extended to the surface position of the periphery of each electronic component, and a stacked three-layer structure of insulating layer, conductive layer and protective layer formed in sequence on the surface of the circuit board. There is no need to assemble a metal shell for shielding, so as to achieve the overall volume reduction. Through the deionized water and volatile alcohols in each layer, a large number of unreacted functional groups can be found in each layer. The rheology can be controlled by volatile alcohols and deionized water through the gaps between hydrogen bonds, so that each layer can form a film of uniform thickness when it is transformed from a wet film to a dry film and cover the electronic components on the circuit board.

DETAILED DESCRIPTION OF THE INVENTION

Please refer to FIGS. 1 to 8. It can be clearly seen from the figures that the invention comprises a circuit board 1. The circuit board 1 has a plurality of electronic components 2 soldered to its surface, and a copper foil layer 11 is provided inside the circuit board 1 and extends to the surface position of the outer periphery of the electronic components 2 to be grounded. The electronic components 2 include at least one chip 21.

Figure 1:
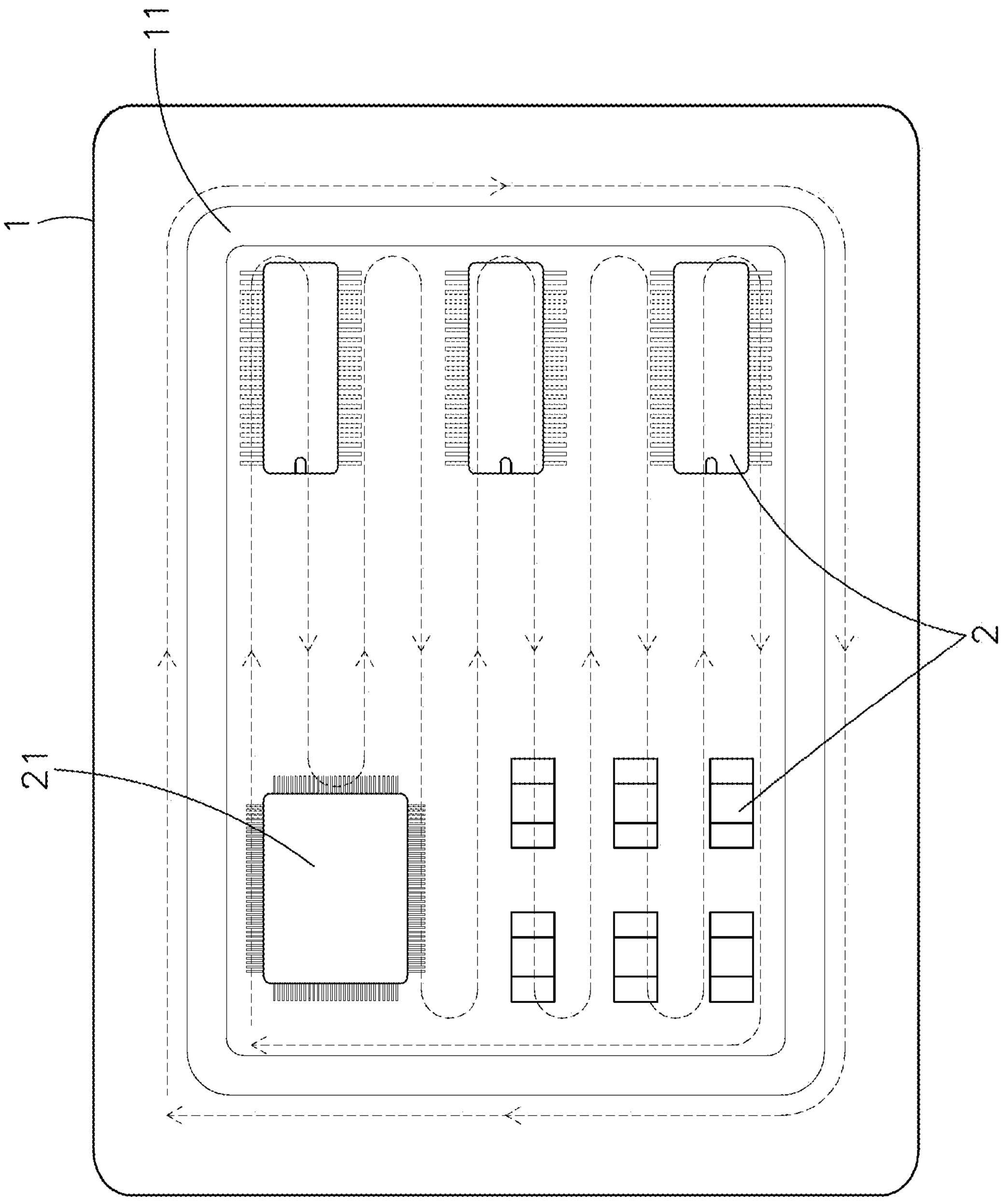
FIG. 1 is a top view schematic diagram of the first operation of the present invention.
Figure 2:
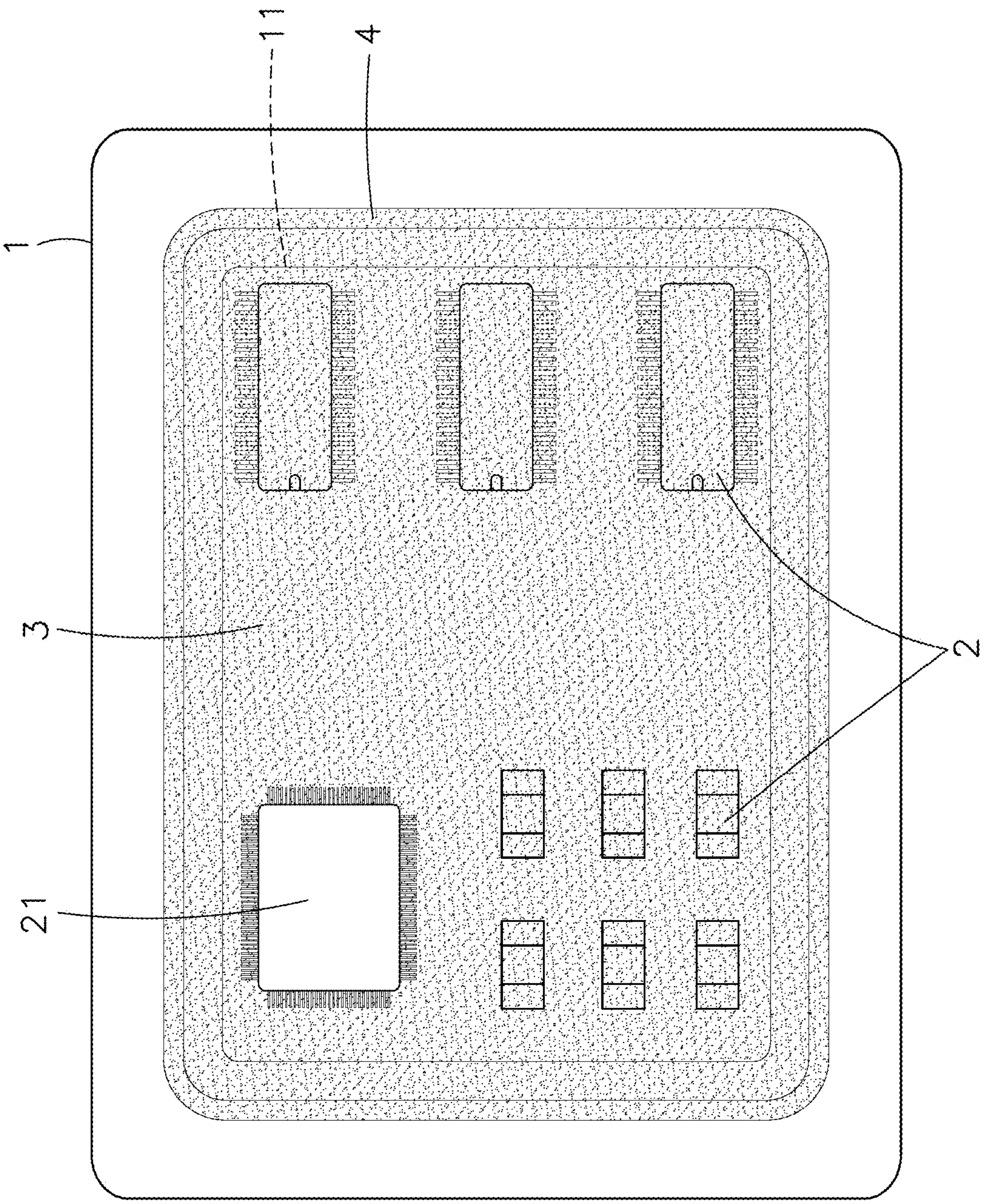
FIG. 2 is a top view schematic diagram of the second operation of the present invention.
Figure 3:
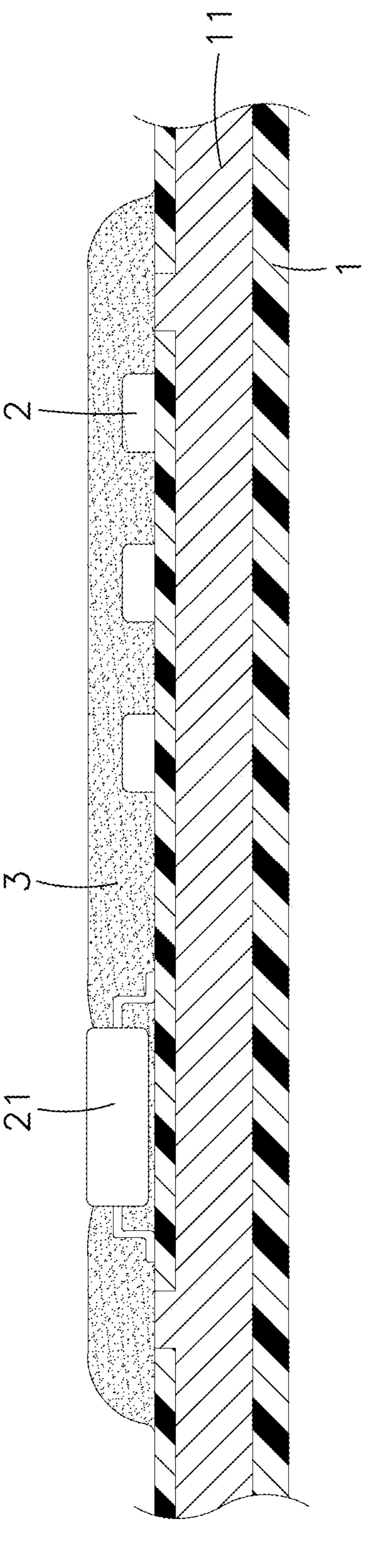
FIG. 3 is a side cross-sectional schematic diagram of the second operation of the present invention.

As shown in FIGS. 1 to 3, an insulating material is applied to the circuit board 1 and the surfaces of the electronic components 2 by a computer-controlled preset coating device (not shown) in a non-contact manner and is fused to form a thin film-like insulating layer 3. However, the surface of the chip 21 is not covered with the insulating layer 3. The preferred coating thickness of the insulating layer 3 is in the range of about 80 m (micrometer) to 100 μm (micrometer), and the preset coating device is included in the general known technology and is not the focus of the present invention, so no separate drawing or text explanation is given.

Figure 4:
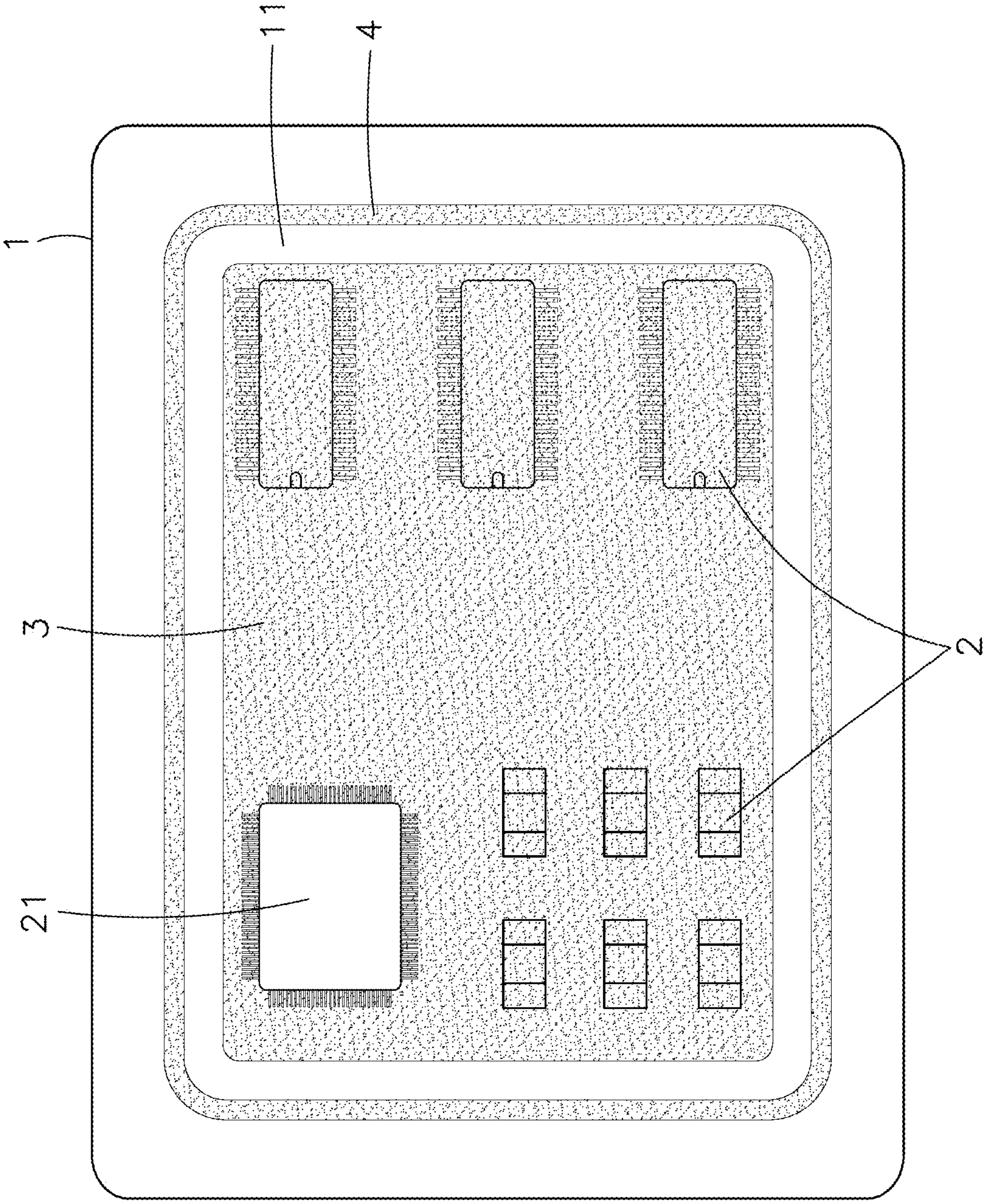
FIG. 4 is a top view schematic diagram of the third operation of the present invention.
Figure 5:
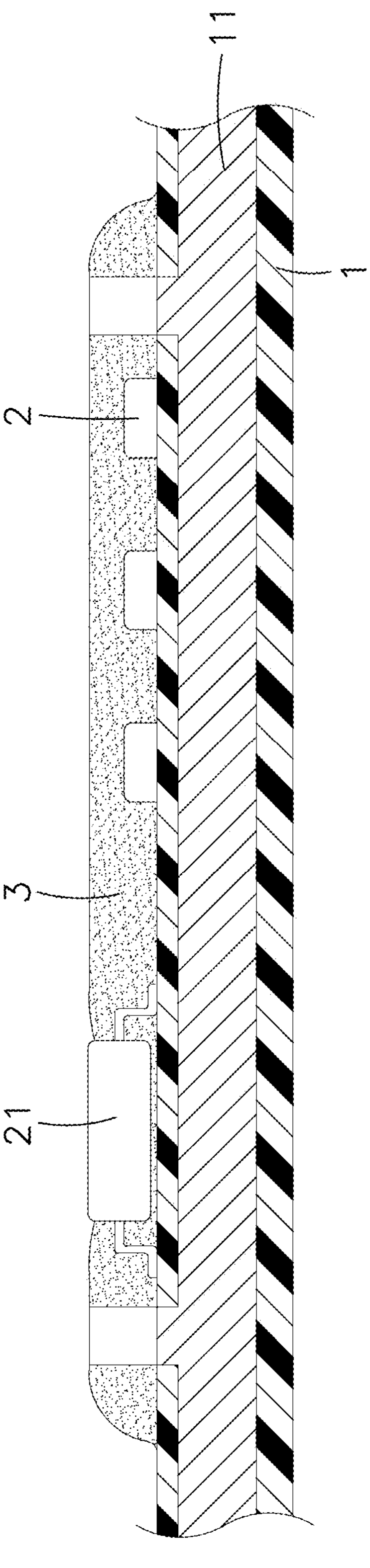
FIG. 5 is a side cross-sectional schematic diagram of the third operation of the present invention.

As shown in FIGS. 4 and 5, a preset laser cutting device (not shown) is used to perform laser cutting operations on the insulating layer 3 on the surface of the circuit board 1 and on one side of the copper foil layer 11 one by one, so that a partial surface of one side of the copper foil layer 11 is exposed to the outside. The preset laser cutting device is included in the general known technology and is not the focus of the present invention, so no separate drawing or text explanation is given. When laser cutting is performed, the insulating layer 3 on one side of the copper foil layer 11 may be cut in a circular manner or partially left uncut, which is within the scope of protection of the present invention.

Figure 6:
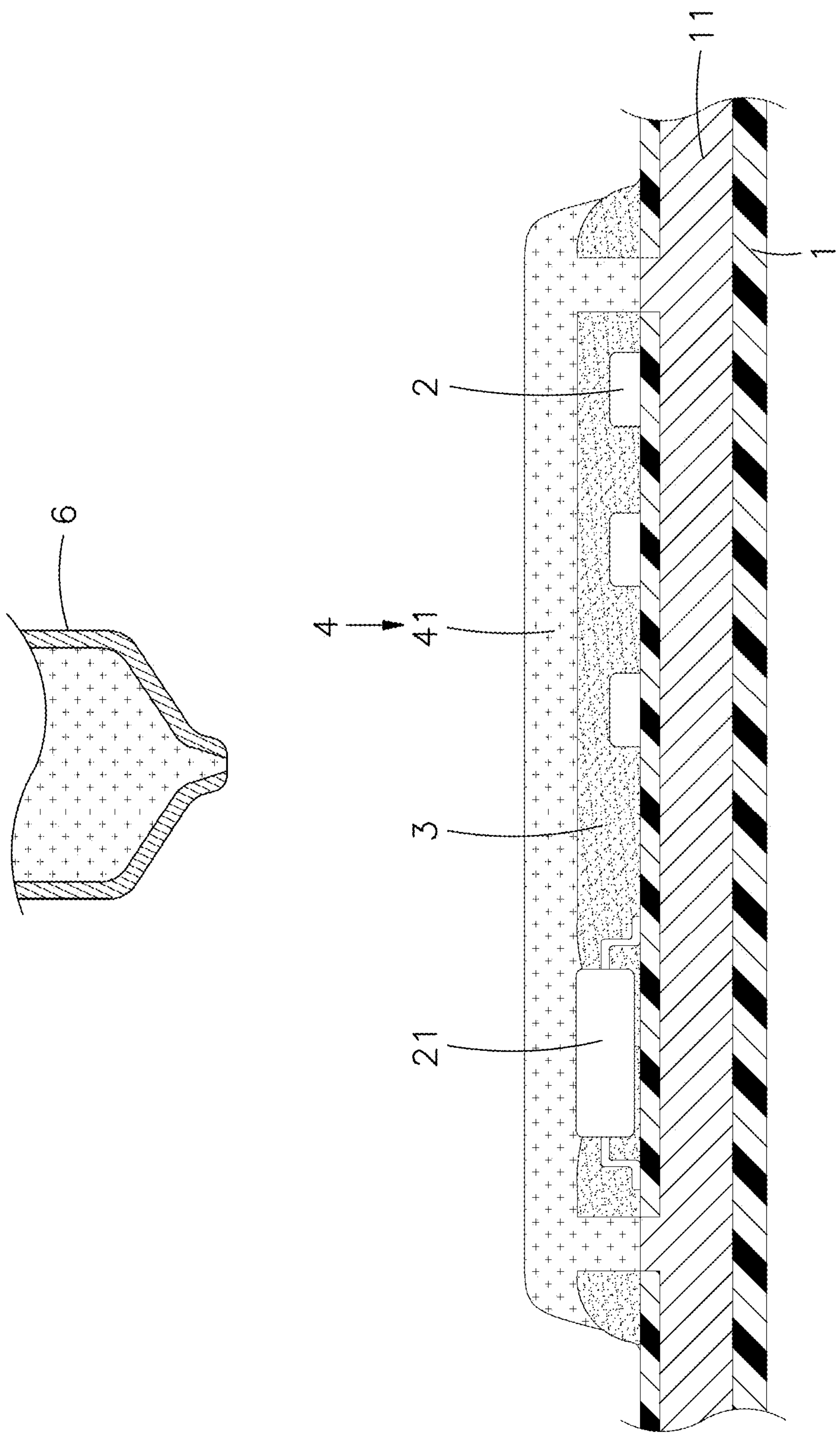
FIG. 6 is a side cross-sectional schematic diagram of the fourth operation of the present invention.

As shown in FIG. 6, the circuit board 1 is coated with a conductive layer 4 by a glue dispensing device 6 on the local surface of the insulating layer 3, the copper foil layer 11 and the chip 21, so that the conductive layer 4 is electrically connected to the copper foil layer 11 inside the circuit board 1. When the chip 21 is in motion, it will generate electromagnetic waves, crosstalk or noise, which can be transmitted through the conductive layer 4 to the copper foil layer 11 for grounding and elimination. The glue dispensing device 6 is within the scope of common knowledge and is not the focus of the present invention, so no additional drawings or textual explanations are provided.

Figure 7:
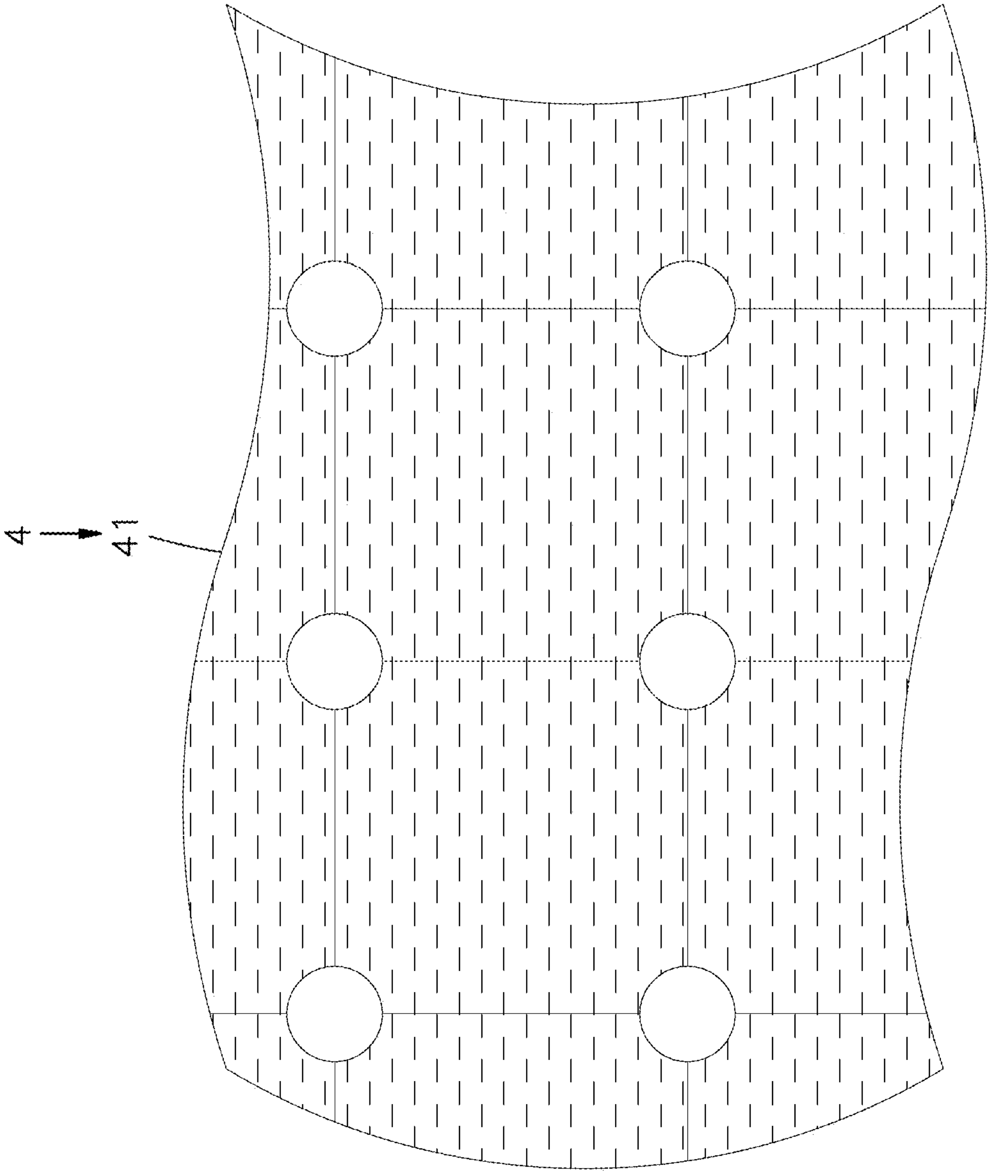
FIG. 7 is a side cross-sectional diagram of the fifth operation of the present invention.
Figure 8:
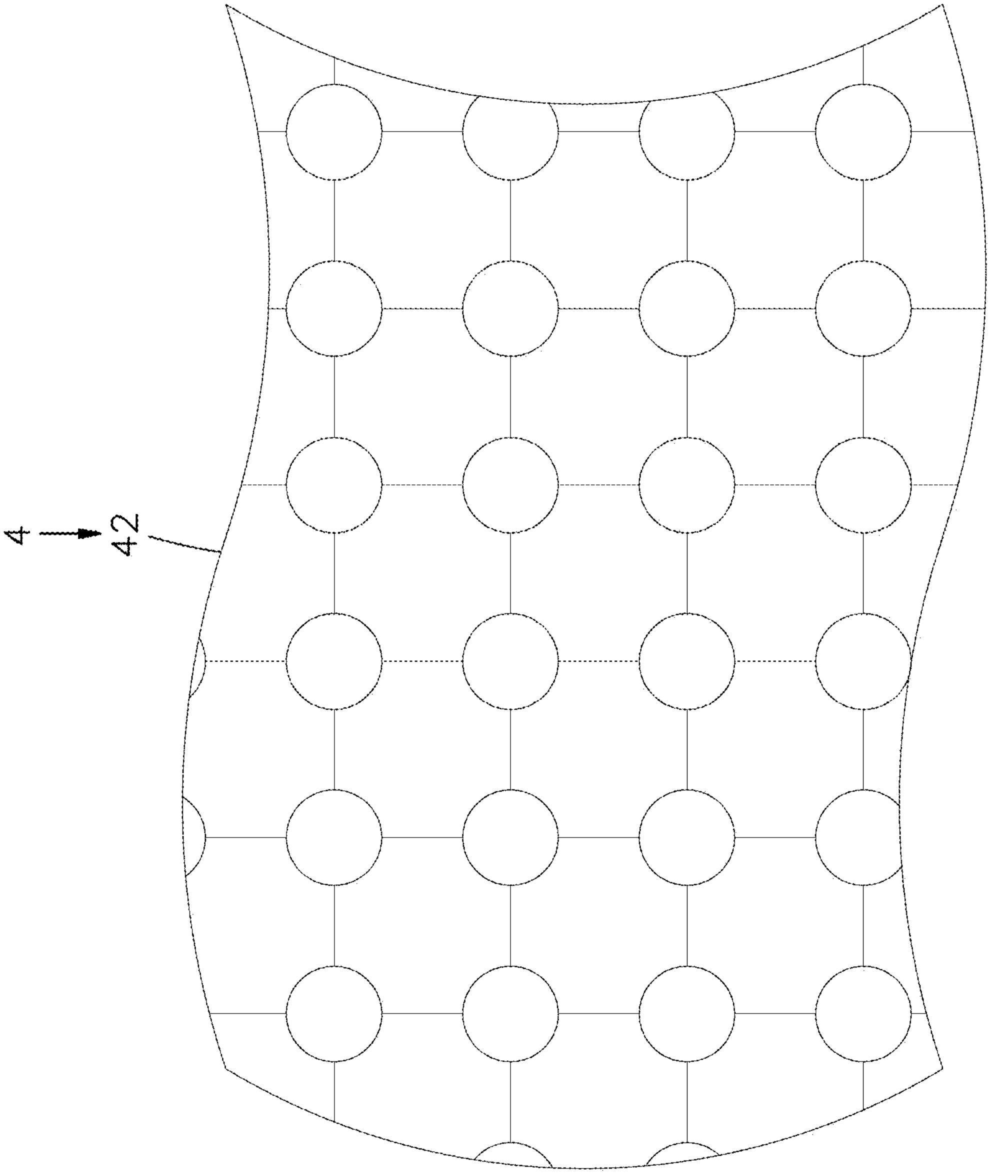
FIG. 8 is a side cross-sectional diagram of the sixth operation of the present invention.
Figure 9:
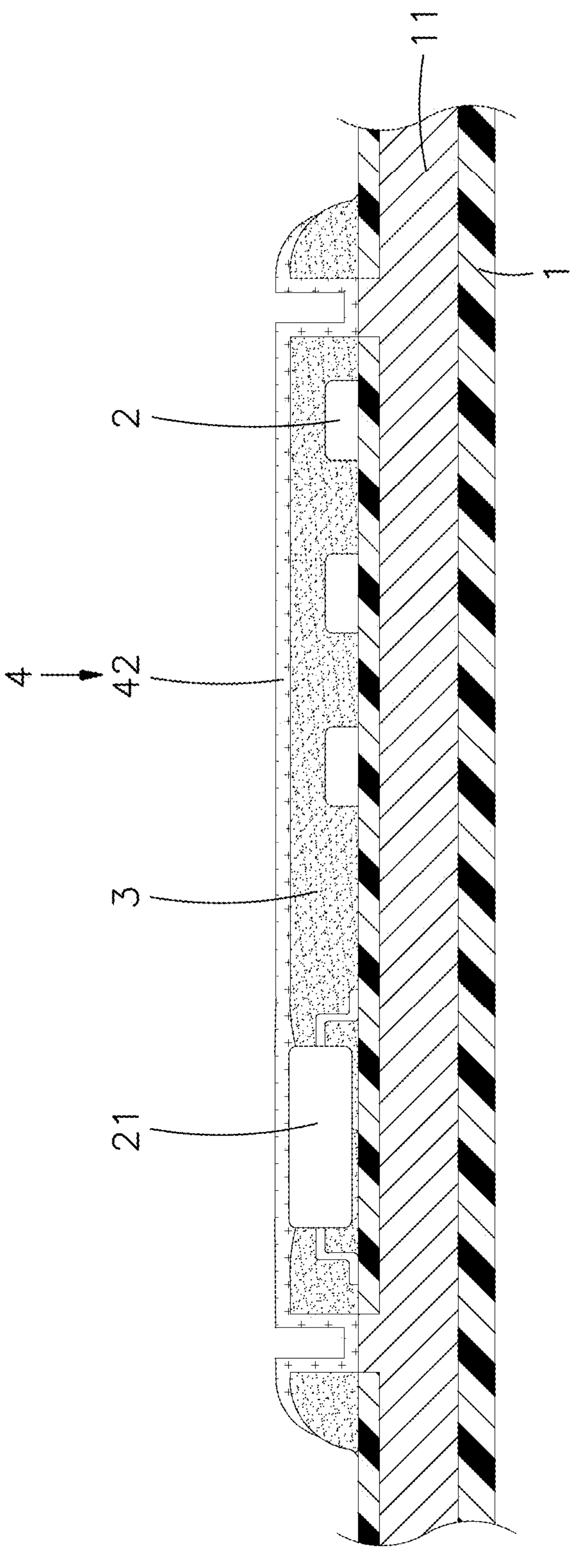
FIG. 9 is a schematic plan view showing that the molecules in the conductive layer of the present invention are arranged to form a network of array gaps before volatility.

As shown in FIG. 6, the conductive layer 4 is used in the glue coating process, and the binder is used to form a bond with the components of the second base material. Furthermore, after the second base material, deionized water and volatile alcohols are mixed, the hydrogen bonds between the molecules will have a certain distance, so that the molecules inside the second base material are arranged to form a network of array gaps. At the same time, as shown in FIG. 7, the second deionized water and volatile alcohols will fill the gaps, so that after the conductive layer 4 is glued on the circuit board 1, the conductive layer 4 is in a state of a wet film 41. At this time, as shown in FIG. 8, the conductive layer 4 can be baked at a high temperature to make the deionized water and volatile alcohols in the conductive layer 4 volatilize, and cause the conductive layer 4 to form a rheology accelerating effect. This shortens the hydrogen bonds between the molecules, so that the molecules are arranged in a network-like array with gaps between them, forming a dry film 42. At the same time, as shown in FIG. 9, the mesh structure of the conductive layer 4 is attached to each electronic component 2 with a uniform thickness to form a solidified film, and the thickness of the conductive layer 4 in the state of the dry film 42 can be approximately 30 μm (micrometer) to 40 μm (micrometer).

Figure 10:
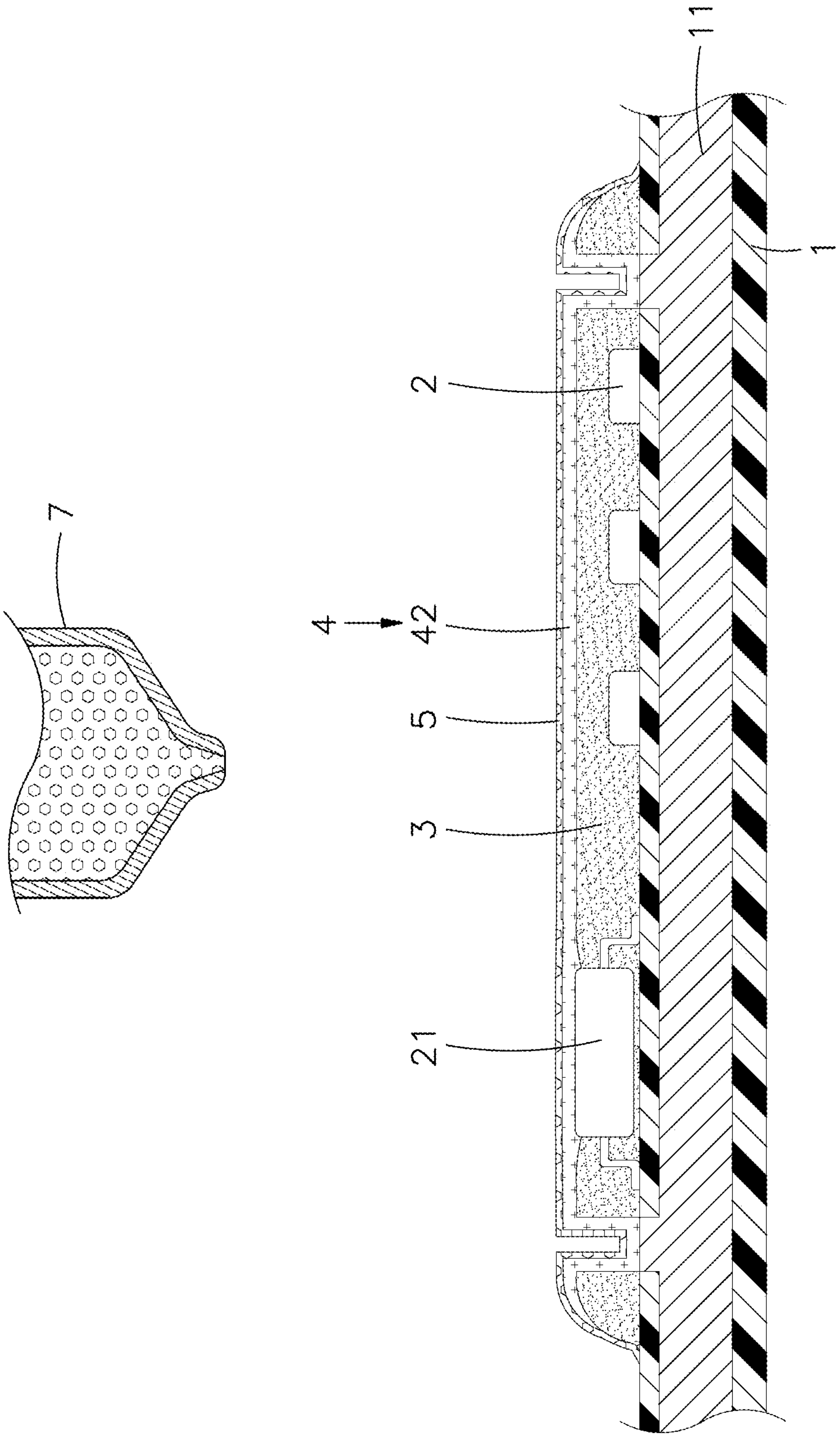
FIG. 10 is a schematic plan view showing that the molecules in the conductive layer of the present invention are arranged to form a network of array gaps after volatility.

As shown in FIG. 10, a protective layer 5 in the form of a film is formed on the surface of the conductive layer 4 and the portion of the first insulating layer 3 not covered by the conductive layer 4 by a coating device 7 on the circuit board 1. The surface area of the protective layer 5 is larger than the surface area of the first insulating layer 3, and the surface area of the first insulating layer 3 is larger than the surface area of the conductive layer 4, so that a stacked three-layer structure is formed on the surface of the circuit board 1. The electronic components 2 can then be packaged on the circuit board 1 to form a package module, and further a protective film structure is formed using the protective layer 5. The preferred coating thickness of the protective layer 5 may be in the range of about 5 μm (micrometer) to 10 μm (micrometer). The protective layer 5 is sprayed on the circuit board 1 by the coating device 7, or the protective layer 5 can be coated on the circuit board 1 by a dot coating method of a preset coating device and a glue dispensing device 6. Such simple equivalent changes and modifications do not limit the scope of protection of the present invention.

The components of the insulating layer 3 comprise a first base material (approximately 30% to 90% by weight), a first crosslinking agent (approximately 0.3% to 10% by weight), deionized water (approximately 10% to 30% by weight), and volatile alcohols (approximately 30% to 60% by weight). The first base material comprises one or a combination of polyurethane, polyimide, polycarbonate, polyamide, epoxy resin, polyethyleneimine, polymethylsiloxane, acrylic polymer, ether polymer or polyolefin. The first crosslinking agent comprises: high imine methyl ether melamine resin (hmmm) or aziridine or garbodiimide or epoxy crosslinking agent. The volatile alcohol component is: one of methanol or ethanol.

The conductive layer 4 comprises: a second base material (approximately 20% to 50% by weight), a binder (approximately 1% to 40% by weight), a second crosslinking agent (approximately 0.3% to 10% by weight), deionized water (approximately 10% to 30% by weight), and volatile alcohols (approximately 30% to 60% by weight). The components of the second base material comprise: carbon nanotubes, graphene, graphite powder and conductive colloid (such as silver glue, gold glue or copper glue, etc.). The components of the binder comprise: one or a combination of polyurethane, polyimide, polycarbonate, polyamide, polyethylene terephthalate, polyethylene naphthalate, polyethyleneimine, polydimethylsiloxane, acrylic polymer, ether polymer or polyolefin. The second crosslinking agent comprises: high imine methyl ether melamine resin (hmmm) or aziridine or garbodiimide. The volatile alcohol component is one of methanol and ethanol.

The protective layer 5 comprises: a third base material (approximately 20% to 50% by weight), a heat dissipation material (approximately 10% to 40% by weight), a third crosslinking agent (approximately 0.3% to 10% by weight), deionized water (approximately 10% to 30% by weight), and volatile alcohols (approximately 30% to 60% by weight). The third base material comprises one or a combination of polyurethane, polyimide, polycarbonate, polyamide, polyethylene terephthalate, polyethylene naphthalate, polyethyleneimine, polydimethylsiloxane, acrylic polymer, ether polymer or polyolefin. The components of the heat dissipation material comprise: boron nitride, aluminum oxide, aluminum nitride, etc. The third crosslinking agent comprises: high imine methyl ether melamine resin (hmmm) or aziridine or garbodiimide, etc. The volatile alcohol component is one of methanol and ethanol.

However, the first base material, the first crosslinking agent, the deionized water and the volatile alcohols in the insulating layer 3 will also produce the same reaction and phenomenon as the wet film 41 and the dry film 42 of the conductive layer 4 after mixing. The third base material, the third crosslinking agent, the deionized water and the volatile alcohols in the protective layer 5 will also produce the same reaction and phenomenon as the wet film 41 and the dry film 42 of the conductive layer 4 after mixing. Here, the conductive layer 4 is used as an example for description and illustration. The main protection point of the present invention is to add and mix deionized water and volatile alcohols to each layer so that each layer forms a wet film 41 and a dry film 42.

When the conductive layer 4 is in a wet film 41 state, the particles in the second base material mixed with the binder are divided into: charged non-ionic type (for example: carbon tube, graphene, etc.), cationic (for example: silver colloid, etc.), and anionic (mixed polymer material). When migration occurs between charged non-ionic type, cationic and anionic, the cationic silver ions will sink to the bottom to form an electrical connection with the contact, and the charged non-ionic type polymer material floating on the upper surface forms a high-impedance protective layer. Thereby, the protective layer 5 can be added or not added on the conductive layer 4 according to product requirements and process requirements.

When the conductive layer 4 is in a dry film 42 state, the second base material mixed with the second crosslinking agent can utilize the second crosslinking agent to produce a close bonding effect between the particles of the components through chemical bonds, thereby providing the conductive layer 4 with a viscosity of about 30000 Pa·s (poise) to 100000 Pa·s (poise), so that the conductive layer 4 can be coated on the surface of the circuit board 1 to form a stable and firm effect. At the same time, the insulating layer 3 and the protective layer 5 can also form a close bonding effect with a viscosity of about 30000 Pa·s (poise) to 100000 Pa·s (poise) through the first crosslinking agent and the first base material, the third crosslinking agent and the third base material. The electronic components 2 can be packaged on the circuit board 1 through the insulating layer 3, the conductive layer 4, and the protective layer 5, so that the circuit board 1 can be designed in a soft, flexible and thin structure, thereby meeting the development trend of various electronic products such as smart phones, smart watches or wearable devices.

In addition, in the preferred embodiment of the present invention, the copper foil layer 11 is integrated into the circuit board 1, and one side of the surface is flat against the surface of the circuit board 1. One side of the surface of the copper foil layer 11 can also be higher or lower than the surface of the circuit board 1, so that the surface of the copper foil layer 11 can be exposed on one side of the surface of the electronic components 2 on the circuit board 1. Such simple equivalent changes and modifications do not limit the scope of protection of this creation.

In a preferred embodiment of the present invention, the circuit board 1 is a flexible circuit board (FPC) or the like, and the circuit board 1 has at least one copper foil layer 11 for forming a contact. The preferred thickness range of the copper foil layer 11 is about 0.3 mm to 0.8 mm (millimeter).

Therefore, the present invention has the following advantages when applied in practice:

1. By adding volatile alcohols into the insulating layer 3, the conductive layer 4 and the protective layer 5, an azeotrope phenomenon can be generated between the volatile alcohols and the deionized water, thereby, the volatile alcohols provide the function of reducing the tension of deionized water to relatively improve the adhesion of each layer, and accelerates the volatility of deionized water and the rheology strength of each layer.
2. The insulating layer 3, the conductive layer 4 and the protective layer 5 each have a large number of unreacted functional groups, and by adding volatile alcohols and deionized water, the hydrogen bonds between the molecules can be spaced at a certain distance, thereby forming a network of array gaps in the molecular arrangement. When deionized water and volatile alcohols are volatile, the hydrogen bonds between the molecules are shortened, and the molecules are arranged into a network with gaps between them, forming a compact state. Thus, the rheology of each layer can be controlled by volatile alcohols and deionized water, so that each layer can form a film of uniform thickness when it is transformed from a wet film to a dry film and cover the electronic components on the circuit board.
3. When the chip 21 of the electronic components 2 is in operation, interferences such as electromagnetic waves, crosstalk or noise may be generated, which can be eliminated by transmitting them to the copper foil layer 11 through the conductive layer 4 for grounding. Therefore, there is no need to assemble a metal shell for shielding, so as to achieve overall volume miniaturization. The surface of the circuit board 1 is formed with an insulating layer 3, a conductive layer 4, and a protective layer 5 in sequence, so that the surface of the circuit board 1 forms a stacked three-layer structure, wherein the first crosslinking agent, the second crosslinking agent, and the third crosslinking agent in the components of each layer are further crosslinked with the amino (—NH2), carboxyl (—COOH), and amide bond (—CONH— or —NHCO—) functional groups of the insulating layer 3, the conductive layer 4, and the protective layer 5, so as to form a stable bonding effect that is not easy to peel off. Furthermore, when the electronic components 2 on the circuit board 1 are damaged or fail, the insulating layer 3, the conductive layer 4, and the protective layer 5 can be torn off at the same time by the combined effect of the first crosslinking agent, the second crosslinking agent and the third crosslinking agent, so as to facilitate the repair of the circuit board 1.

What is claimed is:

1. A shieldable circuit board structure, comprising:

a circuit board comprising a plurality of electronic components welded to a surface thereof and a copper foil layer arranged in said circuit board and extended to a surface position of an outer periphery of said electronic components for use as a ground, said electronic components comprising at least one chip, said copper foil layer having a thickness ranging from 0.3 mm to 0.8 mm;

an insulating layer coated and fused on the surface of said circuit board and said electronic components beyond a surface of said at least one chip and a surface of one side of said copper foil layer, said insulating layer comprising a first base material, a first crosslinking agent, deionized water and volatile alcohols, said insulating layer having a coating thickness ranging from 80 μm (micrometers) to 100 μm (micrometers);

a conductive layer coated and formed on a part of said insulating layer, said copper foil layer and a part of the surface of said at least one chip, so that said conductive layer and said copper foil layer form an electrical connection to be grounded and conducted, said conductive layer comprising a second base material, a binder, a second crosslinking agent, deionized water and volatile alcohols, a coating thickness of said conductive layer ranging from 30 μm (micrometers) to 40 μm (micrometers); and a protective layer coated and formed on a surface of said conductive layer and the portion of said insulating layer not covered by said conductive layer, said protective layer comprising a third base material, a third crosslinking agent, a heat dissipation material, deionized water and volatile alcohols, a coating thickness of said protective layer ranging from 5 μm (micrometers) to 10 μm (micrometers), the rheological strength of said insulating layer, said conductive layer and said protective layer being controllable by said deionized water and said volatile alcohols, so that each of said insulating layer, said conductive layer and said protective layer forms a film of uniform thickness and covers said electronic components of said circuit board when the respective layer transformed from a wet film to a dry film.

2. The shieldable circuit board structure as claimed in claim 1, wherein said copper foil layer is bonded to an inside of said circuit board with a surface of one side thereof flatly attached to the surface of said circuit board.

3. The shieldable circuit board structure as claimed in claim 1, wherein said insulating layer comprises said first base material (30% to 90% by weight), said first crosslinking agent (0.3% to 10% by weight), deionized water (10% to 30% by weight) and volatile alcohols (30% to 60% by weight), said first base material comprising one or a combination of polyurethane, polyimide, polycarbonate, polyamide, epoxy resin, polyethyleneimine, polydimethylsiloxane, acrylic polymer, ether polymer and polyolefin, said first crosslinking agent being selected from the group of high imine methyl ether melamine resin (hmmm), aziridine, carbodiimide and epoxy crosslinking agent, said volatile alcohols selectively comprising methanol or ethanol.

4. The shieldable circuit board structure as claimed in claim 1, wherein said conductive layer comprises said second base material (20% to 50% by weight), said binder (1% to 40% by weight), said second crosslinking agent (about 0.3% to 10% by weight), deionized water (10% to 30% by weight) and volatile alcohols (30% to 60% by weight), said second base material comprising a mixture of carbon nanotubes, graphene, silver-coated copper and conductive colloid, said binder comprising one or a combination of polyurethane, polyimide, polycarbonate, polyamide, polyethylene terephthalate, polyethylene naphthalate, polyethyleneimine, polydimethylsiloxane, acrylic polymer, ether polymer and polyolefin, said second crosslinking agent being selected from the group of high imine methyl etherified melamine resin, aziridine and carbodiimide, said volatile alcohols selectively comprising methanol or ethanol.

5. The shieldable circuit board structure as claimed in claim 1, wherein said protective layer comprises: said third base material (20% to 50% by weight), said heat dissipation material (10% to 40% by weight), said third crosslinking agent (about 0.3% to 10% by weight), deionized water (10% to 30% by weight) and volatile alcohols (30% to 60% by weight), said third base material comprising one or a combination of polyurethane, polyimide, polycarbonate, polyamide, polyethylene terephthalate, polyethylene naphthalate, polyethyleneimine, polydimethylsiloxane, acrylic polymer, ether polymer and polyolefin, said heat dissipation material being selected from the group of boron nitride, aluminum oxide and aluminum nitride, said third crosslinking agent being selected from the group of high imine methyl etherified melamine resin, aziridine and carbodiimide, said volatile alcohols selectively comprising methanol or ethanol.

6. The shieldable circuit board structure as claimed in claim 1, wherein said first base material, said first crosslinking agent, said deionized water and said volatile alcohols of said insulating layer are mixed so that the molecules in said insulating layer are arranged to form a network of array gaps.

7. The shieldable circuit board structure as claimed in claim 1, wherein said second base material, said binder, said second crosslinking agent, said deionized water and said volatile alcohols of said conductive layer are mixed so that the molecules in said conductive layer are arranged to form a network of array gaps.

8. The shieldable circuit board structure as claimed in claim 1, wherein said third base material, said third crosslinking agent, said heat dissipation material, said deionized water and said volatile alcohols of said protective layer are mixed so that the molecules in said insulating layer are arranged to form a network of array gaps.

9. The shieldable circuit board structure as claimed in claim 1, wherein a viscosity of said insulating layer is 30000 Pa·s (poise)~100000 Pa·s (poise).

10. The shieldable circuit board structure as claimed in claim 1, wherein a viscosity of said conductive layer is 30000 Pa·s (poise)~100000 Pa·s (poise).

11. A shieldable circuit board structure, comprising:

a circuit board comprising a plurality of electronic components welded to a surface thereof and a copper foil layer arranged in said circuit board and extended to a surface position of an outer periphery of said electronic components for use as a ground, said electronic components comprising at least one chip, said copper foil layer having a thickness ranging from 0.3 mm to 0.8 mm;

an insulating layer coated and fused on the surface of said circuit board and said electronic components beyond a surface of said at least one chip and a surface of one side of said copper foil layer, said insulating layer comprising a first base material, a first crosslinking agent, deionized water and volatile alcohols, said insulating layer having a coating thickness ranging from 80 μm (micrometers) to 100 μm (micrometers); and a conductive layer coated and formed on a part of said insulating layer, said copper foil layer and a part of the surface of said at least one chip, so that said conductive layer and said copper foil layer form an electrical connection to be grounded and conducted, said conductive layer comprising a second base material, a binder, a second crosslinking agent, deionized water and volatile alcohols, a coating thickness of said conductive layer ranging from 30 μm (micrometers) to 40 μm (micrometers), a rheological strength of said insulating layer, said conductive layer and a protective layer being controlled by said deionized water and said volatile alcohols, so that each of said insulating layer, said conductive layer and said protective layer forms a film of uniform thickness and covers said electronic components of said circuit board when the respective layer transformed from a wet film to a dry film.

12. The shieldable circuit board structure as claimed in claim 11, wherein said copper foil layer is bonded to an inside of said circuit board with a surface of one side thereof flatly attached to the surface of said circuit board.

13. The shieldable circuit board structure as claimed in claim 11, wherein said insulating layer comprises said first base material (30% to 90% by weight), said first crosslinking agent (0.3% to 10% by weight), deionized water (10% to 30% by weight) and volatile alcohols (30% to 60% by weight), said first base material comprising one or a combination of polyurethane, polyimide, polycarbonate, polyamide, epoxy resin, polyethyleneimine, polydimethylsiloxane, acrylic polymer, ether polymer and polyolefin, said first crosslinking agent being selected from the group of high imine methyl ether melamine resin (hmmm), aziridine, carbodiimide and epoxy crosslinking agent, said volatile alcohols selectively comprising methanol or ethanol.

14. The shieldable circuit board structure as claimed in claim 11, wherein said conductive layer comprises said second base material (20% to 50% by weight), said binder (1% to 40% by weight), said second crosslinking agent (about 0.3% to 10% by weight), deionized water (10% to 30% by weight) and volatile alcohols (30% to 60% by weight), said second base material comprising a mixture of carbon nanotubes, graphene, silver-coated copper and conductive colloid, said binder comprising one or a combination of polyurethane, polyimide, polycarbonate, polyamide, polyethylene terephthalate, polyethylene naphthalate, polyethyleneimine, polydimethylsiloxane, acrylic polymer, ether polymer and polyolefin, said second crosslinking agent being selected from the group of high imine methyl etherified melamine resin, aziridine and carbodiimide, said volatile alcohols selectively comprising methanol or ethanol.

15. The shieldable circuit board structure as claimed in claim 11, wherein said first base material, said first crosslinking agent, said deionized water and said volatile alcohols of said insulating layer are mixed so that the molecules in said insulating layer are arranged to form a network of array gaps.

16. The shieldable circuit board structure as claimed in claim 11, wherein said second base material, said binder, said second crosslinking agent, said deionized water and said volatile alcohols of said conductive layer are mixed so that the molecules in said conductive layer are arranged to form a network of array gaps.

17. The shieldable circuit board structure as claimed in claim 11, wherein a viscosity of said insulating layer is 30000 Pa·s (poise)~100000 Pa·s (poise).

18. The shieldable circuit board structure as claimed in claim 11, wherein a viscosity of said conductive layer is 30000 Pa·s (poise)~100000 Pa·s (poise).

* * * * *